United States Patent
Boles et al.

[11] Patent Number: 6,114,716
[45] Date of Patent: Sep. 5, 2000

[54] HETEROLITHIC MICROWAVE INTEGRATED CIRCUITS

[75] Inventors: Timothy Edward Boles, Tyngsboro; Joel Lee Goodrich, Westford, both of Mass.

[73] Assignee: The Whitaker Corporation, Wilmington, Del.

[21] Appl. No.: 08/845,726

[22] Filed: Apr. 25, 1997

Related U.S. Application Data

[60] Provisional application No. 60/017,120, Mar. 22, 1996.

[30] Foreign Application Priority Data

Mar. 17, 1997 [WO] WIPO ............ PCT/US97/03468

[51] Int. Cl.$^7$ ............ H01L 29/80; H01L 31/112
[52] U.S. Cl. ............ 257/207; 257/208; 257/275; 257/374; 257/395; 257/396; 257/397; 257/446; 257/458; 438/424; 333/246; 333/247
[58] Field of Search ............ 257/275, 458, 257/446, 374, 395, 396, 397, 207, 208; 333/246, 247; 438/424

[56] References Cited

U.S. PATENT DOCUMENTS

| | | | |
|---|---|---|---|
| 5,102,822 | 4/1992 | Calligaro | 437/67 |
| 5,268,310 | 12/1993 | Goodrich et al. | 981/278 |
| 5,693,595 | 12/1997 | Talisa et al. | 505/210 |
| 5,696,466 | 12/1997 | Li | 330/286 |
| 5,872,385 | 2/1999 | Taft et al. | 257/437 |
| 5,874,342 | 2/1999 | Tsai et al. | 438/301 |

FOREIGN PATENT DOCUMENTS

| | | | |
|---|---|---|---|
| 0 342 094A | 11/1989 | European Pat. Off. | H01L 21/76 |
| 0534 271 A2 | 3/1993 | European Pat. Off. | H01L 21/331 |
| 0 592 002 A2 | 4/1994 | European Pat. Off. | H01L 23/482 |
| 359112701 | 6/1984 | Japan . | |
| 359183507 | 10/1984 | Japan . | |
| 363132441 | 6/1988 | Japan . | |
| 406053712 | 2/1994 | Japan . | |
| 406244602 | 9/1994 | Japan . | |
| 09167825 | 6/1997 | Japan . | |
| WO 97/35340 | 3/1997 | WIPO | H01L 21/762 |
| WO 97/35340 | 9/1997 | WIPO | H01L 21/762 |

OTHER PUBLICATIONS

U.S. Patent Application No. 08/640,290, Docket No. 16422, Entitled: "Process For Reducing Bond Resistance In Semiconductor Devices And Circuits". Filed Jul. 22, 1996.

"Glass Microwave IC Packaging Technology", Publication Date, May 10, 1994, Presented by Richard Perko, M/A–COM Inc., Electro International 1994, Hynes Convention Center, Boston, MA, May 10–12, 1994, pp. 857–862.

A New Technology For Si Microwave Power Transistor Manufacturing, XP–002053834, Ping Li, Corp. R&D Center, MA–COM, Inc. Lowell, MA 01853, Timothy Boles, Burlington Semiconductor Operation M/A–COM Inc,, Burlington, MA 01803, pp. 103–106, 1996.

Search Document PCT/US 97/03468, pct international application WO 97/35340.

*Primary Examiner*—William Mintel
*Attorney, Agent, or Firm*—Brian K. Dinicola

[57] ABSTRACT

Silicon conductive vias and pedestals are disclosed for use in microwave integrated circuits. The pedestals are isolated from a ground plane on the bottom surface by glass, while the vias are used to make electrical contact to ground. Electrical circuit elements in the top surface of the integrated circuit are selectively grounded or isolated by the choice of connection to a via or pedestal, respectively.

19 Claims, 4 Drawing Sheets

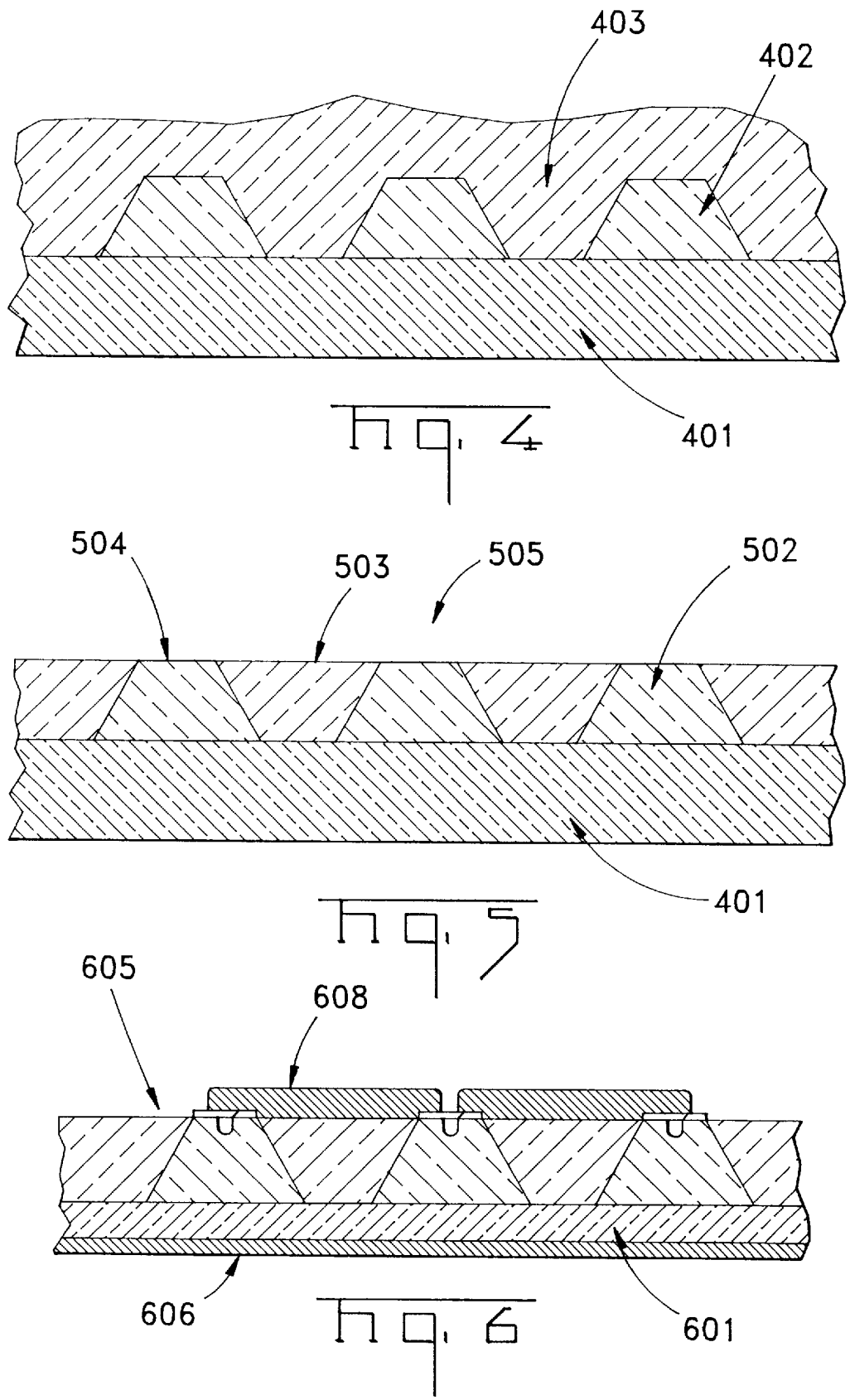

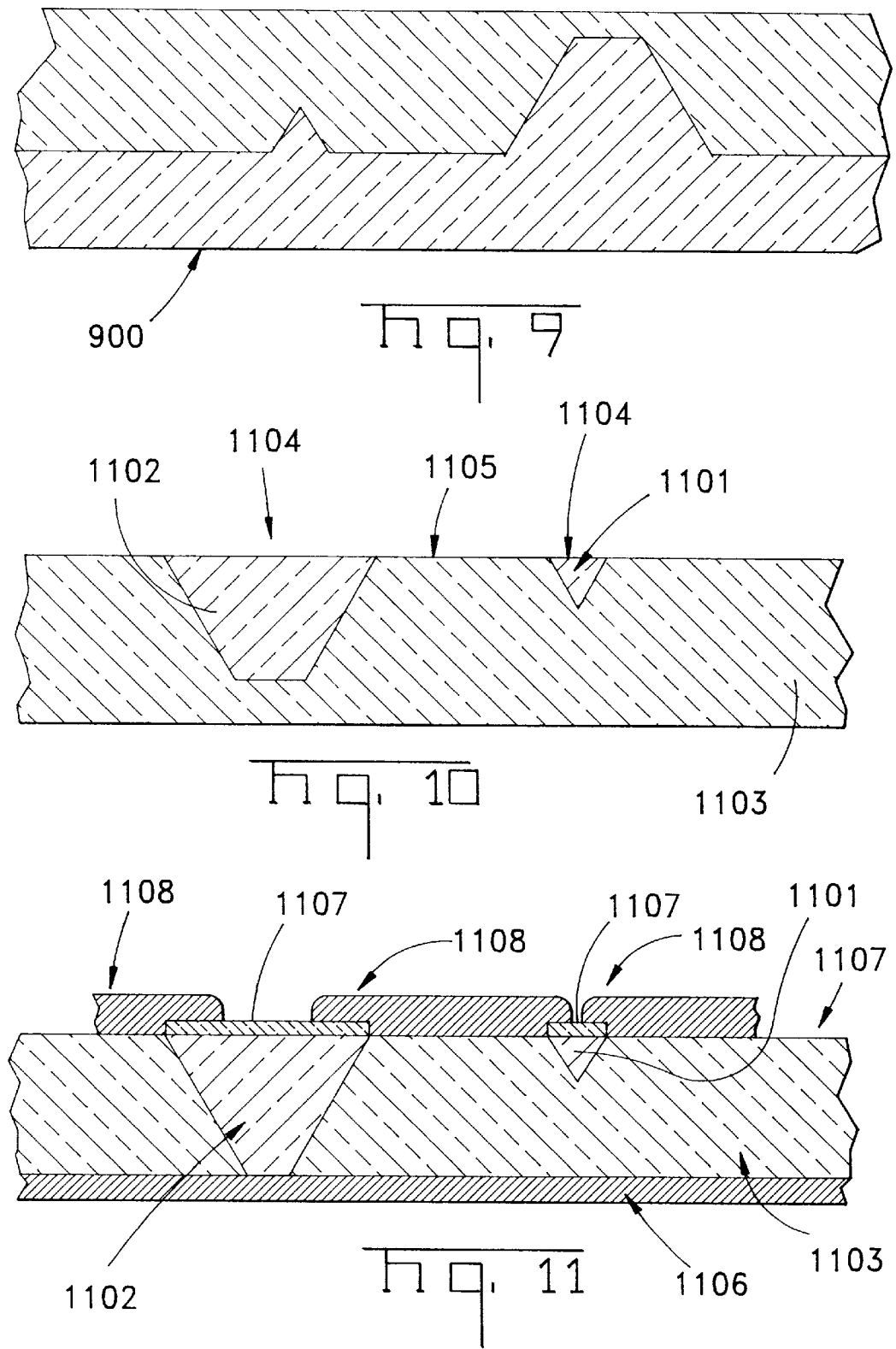

HETEROLITHIC MICROWAVE INTEGRATED CIRCUITS

This application claims benefit of Provisional Appl 60/017,120 filed Mar. 22, 1996.

FIELD OF THE INVENTION

The present invention relates to a heterolithic microwave integrated circuit having a precise dielectric thickness between the top surface and the bottom surface of the integrated circuit.

BACKGROUND OF THE INVENTION

Heterolithic microwave integrated circuits (HMIC) are one viable approach to low cost mass produced integrated circuits for rf and microwave applications. To this end, the use of the heterolithic structure in which silicon pedestals are selectively disposed about various materials to include glass for fabrication of integrated circuits, has been employed in a variety of applications. Examples of such integrated circuits and the processes for the manufacture thereof are as found in U.S. Pat. Nos. 5,268,310 and 5,343,070 to Goodrich et al, the disclosures of which are specifically incorporated herein by reference. In such an integrated circuit, what is generally required is the ability to make series connections and elements on the top surface isolated from connections on the bottom surface. Additionally, the ability to make required connections from the top surface of the integrated circuit to the bottom surface is desired.

The interconnections from devices on the top surface to the bottom surface on which is disposed the ground plane of the HMIC are relatively straight forward. These interconnections are generally effected by the use of heavily doped silicon pedestals for conduction of current from the top surface to the bottom surface of the IC. Conversely, in order to effect the series connections and elements on the top surface, the silicon pedestals affect and are connected to elements on the top surface of the HMIC, but are isolated from the ground plane. In order to achieve this isolation, an insulating material such as polyimide is disposed between the pedestal and the ground plane to act as an isolator between the top surface and the bottom surface so as to electrically isolate selected portions of the top surface from the bottom surface.

FIG. 1 shows the final result of the prior technique of manufacture for the HMIC. The general structure having the silicon pedestals 101 having the glass material 102 for selective isolation of the various pedestals from one another is a relatively standard structure as is described in the above referenced patent application and patent. In the process of fabricating the structure shown in FIG. 1, those pedestals 103 which are effectively isolated from the lower surface of the substrate, a metal layer 104, are effected as follows. After the formation of a pedestal such as that shown at 101, the undersurface or backsurface of the wafer is selectively etched in order to backfill the etched portion with an electrically nonconductive material such as polyimide 105. Thereafter, the metal layer 104 is deposited through standard technique and the selected isolation of elements 106 from the metal ground plane 104 in order to effect the desired interconnections on the top surface of the substrate is achieved.

One of the critical factors in the use of the heterolithic structure as is shown in FIG. 1 is the overall thickness of the integrated circuit. To this end, the thickness of the glass used as the dielectric dictates the inductance of various elements on the top side of the substrate. The various elements, such as inductors, that are used in the rf circuit on the top surface of the substrate must be properly impedance matched and in fact may be part of the matching circuit. Accordingly, the elements such as inductors, which form resonators in a matching circuit, must have a resonant condition at a prescribed frequency in order to properly effect the impedance matching of the various elements. Because the thickness of the substrate dictates the inductance of various resonant elements, it is clear that the precision of the resonant circuit elements on the top surface of the substrate is dependent upon the precision of the thickness of the substrate. Accordingly, in the processing of heterolithic microwave integrated circuits, the thickness of the dielectric between the top surface circuit element and signal lines and the ground plane of the HMIC must be maintained to a very precise value.

In order to properly effect the desired thickness of the dielectric and the isolation of certain elements as shown in FIG. 1, the wafer is processed with the precision of the thickness in mind. To this end, the process of bonding the glass to the silicon through standard fusion techniques as is described in the above referenced patents is effected. Thereafter, the silicon pedestals are etched through the back of the wafer after the final thickness of 5 to 8 mils is achieved. Accordingly, cavities are formed and these cavities must be filled with an electrically nonconductive material in order to properly isolate the selected silicon pedestals from the metal ground plane which is deposited as shown at 104. It is clear that the desired thickness is maintained and thereby the performance characteristics of the various elements and the required impedance matching is carried out with great precision.

Unfortunately, the process fabricating the HMIC with the vias as well as pedestals isolated from the ground plane as is shown in FIG. 1 has proved to be very problematic. The problems encountered in processing the wafer generally are direct results of attempts to process wafers which have been etched to be too thin. Often this is manifest in breakage, as well as incomplete electrical isolation of the series elements. The latter is difficult to inspect after fabrication. The resulting yields are unfortunately very unpredictable ranging from 0% to a maximum of on the order of 68%. Even if it were possible to consistently achieve the yields of 68%, this is an unacceptable value if one is to maintain low cost as is required in the rf and microwave wireless markets.

Accordingly, what is needed is a new heterolithic microwave integrated circuit which affords the precision of thickness of the dielectric between the top surface and the ground plane, thereby enabling good performance characteristics of the resulting circuit while increasing the manufacture yields to an acceptable and consistent level. To this end, what is needed is heterolithic integrated circuits having selectively isolated pedestals for series elements and circuits as well as vias for interconnecting the top surface of the HMIC to the lower surface ground plane with a precise dielectric thickness between the top surface and bottom surface.

SUMMARY OF THE INVENTION

The present invention relates to a heterolithic microwave integrated circuit having selectively disposed silicon conduction members and a dielectric material disposed about said silicon conduction members forming the substrate of the integrated circuit. The dielectric material used in fabricating the dielectric layer between signal lines and elements disposed on the top surface of the HMIC and the ground plane for the integrated circuit on the lower surface of the dielectric is fabricated to have a very precise thickness in order to properly effect the performance and impedance matching of the various elements as described above. Furthermore, the material used as the dielectric is a low loss material at high frequency. The dielectric of the present invention is a single material formed concurrently in the fabrication of the HMIC as opposed to multiple materials which require a backfilling step as is conventionally done.

The present invention envisions two basic structures for various applications in the high frequency art. To this end in one embodiment, the silicon conductive members are fabricated so that they are in electrical contact with elements and devices on the top surface of the substrate of the integrated circuit, while they are electrically insulated from the ground plane by the dielectric material. This particular embodiment in which the silicon conduction members are referred to as pedestals, enables selective isolation of series elements on the top surface from the ground plane on the bottom surface. These elements on the top surface are for example schottky diodes which are required to be in series connection on the top surface. A second embodiment of the present invention envisions an application wherein both isolated pedestals and vias are fabricated in the construction of the HMIC. To this end the pedestals which are isolated from the lower surface ground plane are used as is described in the first embodiment described above. Furthermore, silicon conduction members can be fabricated to effect an electrical connection from the top surface on which the integrated circuit and signals lines are disposed, and the lower surface ground plane. Silicon conduction members used in this manner are referred to as vias.

The integrated circuits as described above, have the performance advantages required and yet are fabricated in consistently high yields as described herein. The result is a heterolithic microwave integrated circuit having a low final cost while maintaining the required performance.

OBJECTS, FEATURES, AND ADVANTAGES

It is an object of the present invention to have HMIC devices with selective isolation of series components from the IC ground plane alone or in combination with the selective electrical connections of elements on the top surface of the HMIC to the ground plane.

It is a feature of the present invention to have a glass substrate having the required HMIC structure disposed thereon and the required selectively anisotropically etched silicon conductive members disposed therein.

It is a further feature of the present invention to have a heterolithic microwave integrated circuit having the required system performance characteristics through a precise dielectric thickness.

It is an advantage of the present invention to have the required system performance of resonant circuit elements achieved through effective and proper electrical isolation.

It is a further advantage of the present invention to have a low cost HMIC without sacrificing performance.

BRIEF DESCRIPTION OF THE DRAWINGS

FIG. 2 to FIG. 6 show the processing steps of the embodiment of the present invention having isolated pedestals.

FIGS. 7–11 show the processing steps of the embodiment having both vias and isolated pedestals.

DETAILED DESCRIPTION OF THE INVENTION

Figure 2:
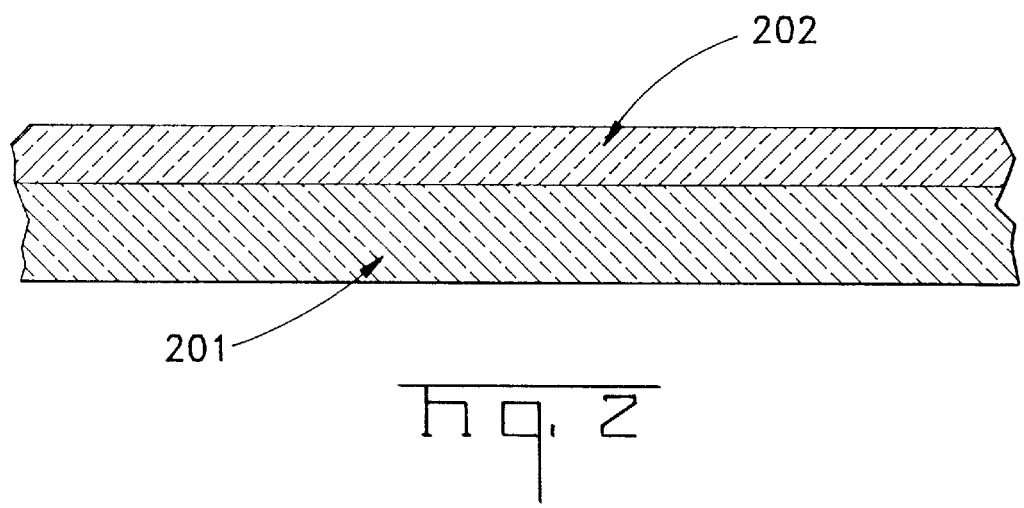

Turning to FIG. 2 the glass substrate layer 201 is shown having been properly fused to a silicon wafer 202 through standard technique. The glass substrate is approximately 20 mils in thickness while the silicon wafer is approximately 15 mils in thickness. The fusion of the two layers is as described herein. The preferred material for the glass is for example Corning 7070, although any dielectric material having a low loss at high frequency and is mechanically expansion matched to silicon will work. The silicon wafer is preferably a monocrystalline material having well-defined crystallographic planes which are exploited during the etching process described herein.

Figure 3:
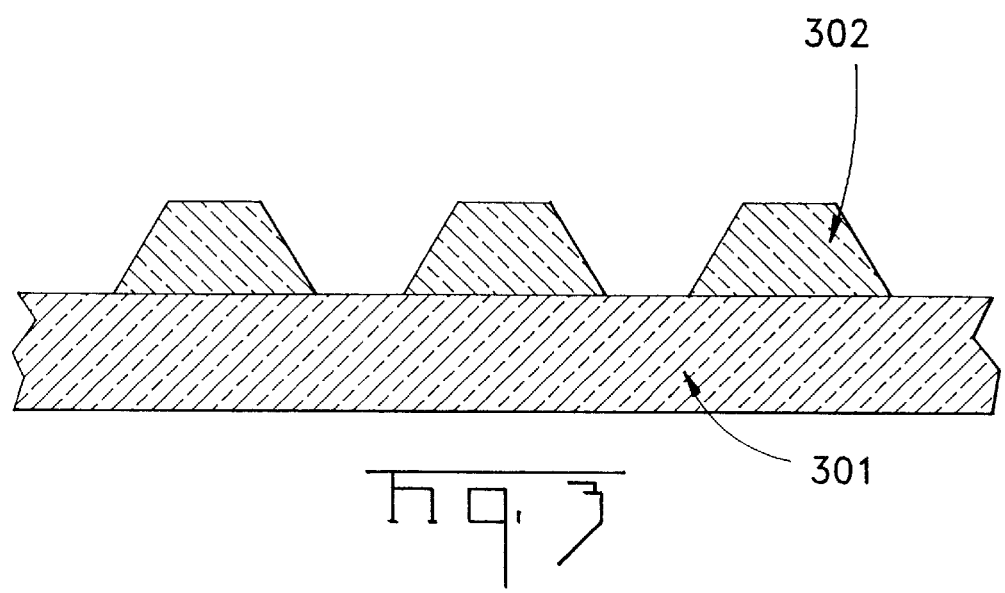

Turning to FIG. 3, the first step in the processing by the present invention is shown where the silicon wafer is anisotropically selectively etched to provide silicon pedestals having a height on the order of 3 to 4 mils. This etching of the silicon pedestals is carried out through a wet etch process, for example, as is described in U.S. Pat. No. 4,210,923 to North et al., and the above-captioned references to Goodrich, et al., disclosures of which are specifically incorporated herein by reference. The orientation of the silicon pedestal sidewalls and top surfaces are well defined in preferred crystallographic planes. The pedestals shown in FIG. 3 are those supporting electronic circuitry on the top surface. These series elements are to be isolated from the metal ground plane on the lower surface of the glass substrate 201 (shown at 301 and 401 in FIG. 3 and FIGS. 4, 5, respectively). Finally, it is of interest to note that the silicon pedestals are doped $n^+$ with a suitable donor dopant to a doping concentration to achieve a resistivity on the order of 0.002–0.006 ohm/cm. Thereafter, turning to FIG. 4 the silicon pedestals 402 are shown effectively isolated from one another electrically through the fusion of a glass material 403 as described herein.

The process of fusing glass to silicon in the present invention is as described presently. The silicon having been selectively etched as described above has further a peripheral rim about the wafer that acts as a seal. This seal becomes important in effecting a pressure differential as described herein. The silicon having the selectively etched regions has disposed thereon a glass substrate preferably Corning 7070. This assembly is thereafter disposed in a tube and placed at a selected temperature between the range of about room temperature and about 500° C. and is placed in a vacuum chamber. This vacuum chamber is thereafter pumped down to $10^{-5}$ Torr. Thereafter, the assembly is heated to on the order of preferably 800° C. The glass material thereafter becomes malleable and the assembly is thereafter removed from the high pressure environment. In removing the assembly from the vacuum chamber a pressure differential is created. The cavities in the silicon is at approximately $10^{-5}$ Torr and by virtue of the seal effected by the ridge about the periphery of the wafer, this pressure is maintained. However, the assembly, in particular the upper surface of the glass is now at atmospheric pressure on the order of $10^3$ Torr. This pressure differential enables the malleable glass to be fused into the cavities which are at a very low pressure. During this process, selected small pockets or voids are observed in the lower corners of the pedestals. These pockets are of little concern, since the polishing subsequent to this processing step effectively eliminates the pockets. Finally, it is of interest to note that the fusion of the glass layer 201, 401 to the silicon substrate 202 does not require the ridge for sealing purposes and can be effected by heating and pressure differential techniques described above.

Thereafter in order to properly planarize the top surface of the substrate to a height approximately level with the top surface of the silicon pedestals as shown in FIG. 5, a polishing technique is employed. The polishing technique is a standard technique well known to the artisan of ordinary skill. The polishing height is effected generally to a level so as to expose the pedestals as is shown at 503.

The end result, as shown in FIG. 5, is a substrate of glass on the order of approximately 20 mils having the selectively anisotropically etched silicon pedestals 502 selectively isolated from one another by the glass material 503, while being properly exposed as at 504 for effective placement and interconnection of device circuitry on the top surface 505 of the HMIC. In a step not shown through drawing figures, an epitaxial layer is formed as is required on the top surfaces 504 of the silicon pedestals. This processing step is effected for all silicon pedestals as is required in order to properly effect the electrical connections for various devices. To this end the silicon pedestals 302, 402, 502 are as stated highly doped n+, and in order to effect devices such as a schottky diode where a metal/semiconductor barrier potentials is required, an epitaxial layer must be grown on the silicon pedestals having a doping concentration which is lower than that of the pedestals in order to avoid the shorting effects that can result through the highly conductive path of the silicon pedestals. Finally, as is shown in FIG. 6, the backside surface of glass 601 is polished through the same technique that is used to polish the top surface of the glass described above, in order to effect the proper thickness of the glass layer between the top surface and the ground plane. The thickness of the glass dielectric between the top surface 605 of the HMIC and the ground plane 606 of 5 to 8 mils and has the attendant benefit of performance at the desired center frequencies for resonant elements on the top surface of the substrate.

Figure 7A:
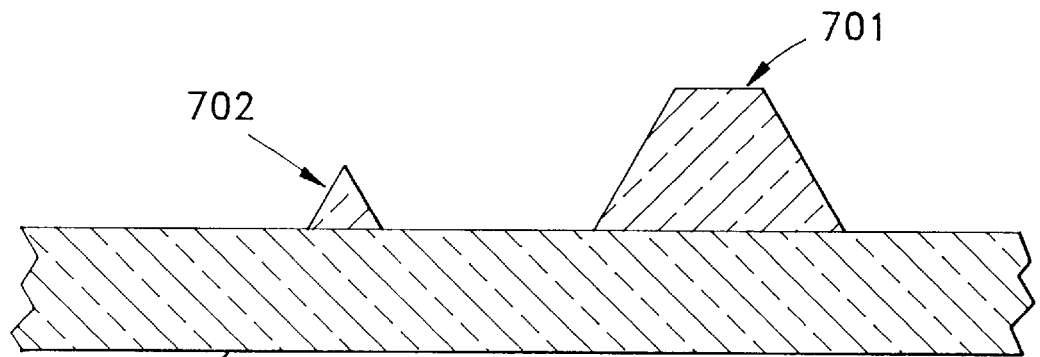
Figure 7B:
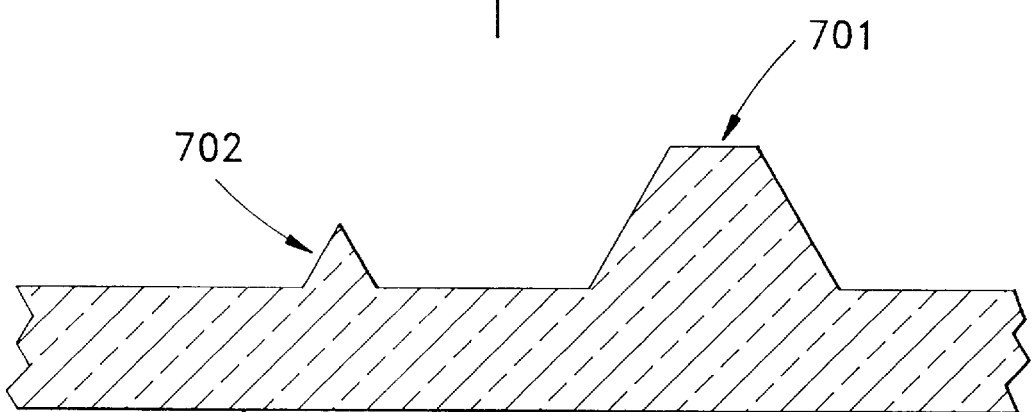

The process for manufacture of the second embodiment of the present invention is now described. Turning to FIG. 7a, a wafer of silicon of a thickness on the order of 35 mils has both selectively located anisotropically etched pedestals 702 and vias 701. After further processing described herein, the pedestals 702 will be electrically isolated from the ground plane and the vias 701 will serve as an electrical path between the top surface and ground plane. Alternatively, a silicon wafer of approximately 15 mils thickness is bonded to a glass substrate 700 through standard technique as described previously. The differing heights and profiles of the pedestals of silicon 701, 702 as shown in FIG. 7 are effected through wet etching techniques as described in the reference North et al. To this end, in order to fabricate the pedestals 701 which function as vias in the final product, a differing mask pattern than that of the pedestals 702 which serve to isolate series elements on the top surface of the HMIC is used. Additionally, the profiles and heights of the vias and pedestals 701 and 702, respectively are achieved through the different masks and anisotropic etching processes. These etching processes are well known in the art. Finally, to effect different profiles and heights the silicon pedestals are properly doped $n^+$ as described above.

Figure 8:
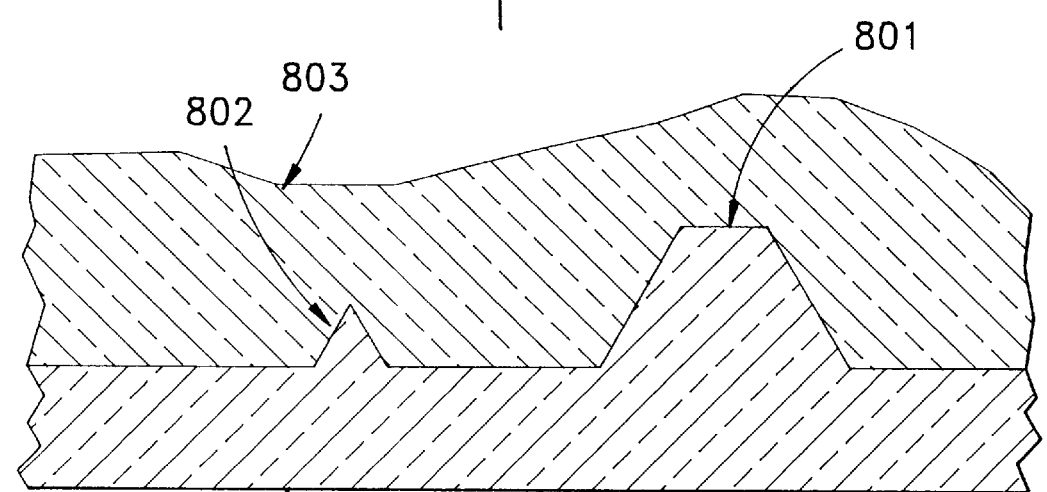

Turning to FIG. 8, glass material 803 preferably the same materials as is described above is fused in a thickness on the order of 20 mils on top of the base substrate of silicon 800. This layer of glass effectively isolates the pedestals and vias 802 and 801, respectively and will serve not only in this function but as the dielectric material for the circuit. Turning to FIG. 9, we see the final result after replanarization through standard polishing techniques. The glass layer is polished to a thickness on the order of 15 mils, although other thicknesses are possible, and it is preferred to make this layer as thick as possible. Thereafter, the wafer is "flipped over" and the approximately 20 mil thick layer of silicon 900 is removed through standard polishing techniques. This polishing effects a front side surface quality to the backside surface of the wafer. Finally, as is seen in FIG. 10 the wafer is a "flipped over" HMIC having selectively disposed glass material in-between the silicon pedestals as desired. The result, as is shown in FIG. 10, is a layer of glass on the order of approximately 20 mils in thickness having selectively etched silicon pedestals 1101 and vias 1102 isolated electrically from one another by the glass material 1103. The final step in the processing of the substrate is as shown in FIGS. 10 and 11 in which the glass layer 1103 is polished to a final thickness on the order of 5 to 8 mils exposing the shunt via 1102 at the lower surface of the substrate. The via 1102 is electrically connected to the ground plane 1106 fabricated by standard metallization techniques. The series elements disposed on the top surface 1105 which are connected to pedestals 1101 having been isolated by the glass material 1103. The polishing process exposes the pedestals and vias as at 1104 enabling effective placement and interconnection of device circuitry on the top surface 1105 of the HMIC.

Thereafter, an epitaxial layer 1107 is formed as is required on the top surface of the silicon pedestals 1104 to effect the barriers as described above. The fabrication of the integrated circuits on the top surface and the various elements, 1108 (shown at 608 in FIG. 6), such as devices both active and passive as well as signal lines by standard metallization technique.

As can be appreciated, the resulting structure has functional characteristics of performance that are highly desired while the yield of manufacture is maintained at an acceptable and consistent level. The end result is a low cost heterolithic microwave integrated circuit with the performance characteristics desired. The major reason for the ability to fabricate the HMIC in high yield, therefore at low cost is because the thickness of the glass substrate is always great enough to avoid the attendant problems of processing a thin wafer. The backside processing as described by "flipping" the chip over during the processing enables standard fabrication techniques to be performed on a wafer of adequate thickness to avoid breakage. Furthermore, the layers are of sufficient thickness to act as "handles" during processing. Furthermore, the selective etching of the silicon pedestals enables strict control of the height and profiles of the pedestals for desired function. To this end, both shunt vias as well as electrical isolation of series elements on the top surface from the lower ground plane are enabled through the above described process.

Finally, one of the major drawbacks to silicon vias used in high frequency applications is access losses which can be effected from the top surface circuitry by way of the vias to the lower ground plane. A loss occurs when metal signal lines on the top surface of an HMIC effect losses through the pedestal as follows. The transmission lines on the top surface are deposited on a dielectric, for example glass. The side surfaces of the vias pedestals are made very conductive through superdoping $n^{++}$. This $n^{++}$ layer on the side surfaces of the pedestal is effectively a ground plane in-between the metal layer and the dielectric. It also serves to complete a capacitor. Unfortunately, the material on the side surfaces of the pedestal, the $n^{++}$ layer, is lossy at high frequencies.

Figure 1:
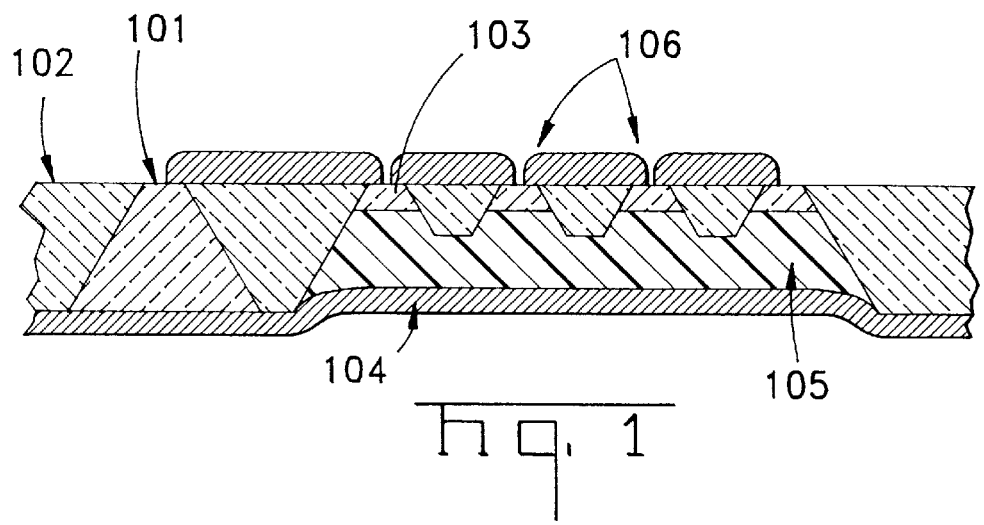
FIG. 1 is a cross-sectional view of the prior art showing the polyimide isolation layers deposited to effect the isolation of selected silicon pedestals.

Accordingly, one technique to reduce the loss is to deposit a layer of cobalt disilicide on the side surfaces of the pedestal. This layer of cobalt disilicide is less lossy than the n$^{++}$ layer. In this way while there is still the coupling to the effective ground plane on the side surfaces of the pedestal via, there is nevertheless a reduction in the loss associated with this coupling. The resulting product of the second process reduces drastically the effective coupling as follows. First of all the geometry of the via is inverted from that which is shown in the conventional design in FIG. 1. Thereby, the effective distance between the metal layer on the top surface and the side surface of the pedestal which forms the effective ground plane is great enough so that electromagnetic coupling is drastically reduced. Furthermore, this increase in the distance reduces capacitive coupling greatly. As is well known in the art, capacitive coupling at high frequency transmission is an undesired parasitic effect. Furthermore, a layer of cobalt disilicide is also preferably deposited on the side surfaces of the pedestal in order to effectively reduce the losses by the selected choice of material in addition to the increased distance that the structure of the present invention affords.

The invention having been described in detail, it is clear that there are modifications and variations that are readily conceived by the artisan of ordinary skill. To the extent that these modifications and variations are within the theme an spirit of the teaching of the present invention, processes for fabricating heterolithic microwave integrated circuits as described above, these modifications and variations are deemed within the scope of the invention. To this end the process for fabricating the HMIC is one that avoids processing a relatively thin wafer, and enables fabrication of the desired HMIC and its attendant performance benefits in high consistent yield through the processing of a relatively thick layer. It is clear that other processing steps could be taken, but to the extent that such processing steps are mere variations in modifications within the purview of the skilled artisan they are deemed within the scope of the present invention.

What is claimed is:

1. A heterolithic microwave integrated circuit, having a top surface and a lower surface, said integrated circuit comprising:
    at least one pedestal disposed between the top surface and the lower surface;
    dielectric material disposed adjacent said at least one pedestal; and
    dielectric material disposed beneath said at least one pedestal,
        wherein said at least one pedestal is electrically isolated from a ground plane disposed on the lower surface of the integrated circuit by said dielectric material disposed beneath said at least one pedestal,
        and further wherein said dielectric material disposed adjacent said at least one pedestal and said dielectric material disposed beneath said at least one pedestal are a single material.

2. A heterolithic microwave integrated circuit as recited in claim 1, wherein said at least one pedestal has sidewalls in well-defined crystallographic planes.

3. A heterolithic microwave integrated circuit as recited in claim 1 wherein said at least one pedestal is doped to be conductive.

4. A heterolithic microwave integrated circuit as recited in claim 2 wherein said at least one pedestal has a resistivity on the order of 0.002–0.006 ohm/cm.

5. A heterolithic microwave integrated circuit as recited in claim 1 wherein said dielectric material is glass.

6. A heterolithic microwave integrated circuit as recited in claim 1 wherein said dielectric material disposed beneath said at least one pedestal is a substrate layer of glass.

7. A heterolithic microwave integrated circuit, comprising:
    At least one via; dielectric material disposed adjacent said at least one via, said at least one via being electrically connected to a ground plane disposed on a lower surface of the microwave integrated circuit; and
    at least one pedestal; dielectric material disposed adjacent said at least one pedestal and between said at least one pedestal and said ground plane, and wherein said at least one pedestal is electrically isolated from said ground plane by said dielectric material disposed between said at least one pedestal and said ground plane.

8. A heterolithic microwave integrated circuit as recited in claim 7 wherein said at least one pedestal and said at least one via have sidewalls in well defined crystallographic planes.

9. A heterolithic microwave integrated circuit as recited in claim 7 wherein said dielectric material is glass.

10. A heterolithic microwave integrated circuit as recited in claim 8 wherein said sidewall of said vias have a layer of cobalt disilicide disposed thereon.

11. A heterolithic microwave integrated circuit, having a top surface and a lower surface, said integrated circuit comprising:
    at least one pedestal, disposed between the top surface and the lower surface, said at least one pedestal having glass disposed adjacent said at least one pedestal; and
    glass disposed beneath said at least one pedestal,
        wherein said at least one pedestal is electrically isolated from a ground plane disposed on the lower surface of the integrated circuit by said glass disposed beneath said at least one pedestal.

12. A heterolithic microwave integrated circuit as recited in claim 11, wherein said at least one pedestal has sidewalls in well-defined crystallographic planes.

13. A heterolithic microwave integrated circuit as recited in claim 12 wherein said at least one pedestal is doped to be conductive.

14. A heterolithic microwave integrated circuit as recited in claim 3 wherein said pedestals have a resistivity on the order of 0.002–0.006 ohm/cm.

15. A heterolithic microwave integrated circuit, comprising:
    At least one via, glass material disposed adjacent said at least one via, said at least one via being electrically connected to a ground plane on a bottom surface of the microwave integrated circuit;
    and at least one pedestal, said at least one pedestal having glass disposed adjacent said at least one pedestal and between said at least one pedestal and said ground plane, said at least one pedestal being electrically isolated from said ground plane by said glass disposed between said at least one pedestal and said ground plane.

16. A heterolithic microwave integrated circuit as recited in claim 15 wherein said at least one pedestal and said at least one via have sidewalls in well defined crystallographic planes.

17. A heterolithic microwave integrated circuit as recited in claim 15 wherein said sidewall of said vias have a layer of cobalt disilicide disposed thereon.

18. A heterolithic microwave integrated circuit as recited in claim 1 wherein said at least one pedestal is electrically connected to electronic circuitry on a top surface of the microwave integrated circuit.

19. A heterolithic microwave integrated circuit as recited in claim 7 wherein said at least one pedestal and said at least one via are electrically connected to electronic circuitry on a top surface of the microwave integrated circuit.

* * * * *